US011107664B2

(12) United States Patent
Kamaji et al.

(10) Patent No.: US 11,107,664 B2
(45) Date of Patent: Aug. 31, 2021

(54) PLASMA PROCESSING APPARATUS AND PREDICTION APPARATUS OF THE CONDITION OF PLASMA PROCESSING APPARATUS

(71) Applicant: HITACHI HIGH-TECH CORPORATION, Tokyo (JP)

(72) Inventors: Yoshito Kamaji, Tokyo (JP); Masahiro Sumiya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 215 days.

(21) Appl. No.: 16/123,176

(22) Filed: Sep. 6, 2018

(65) Prior Publication Data

US 2019/0237309 A1  Aug. 1, 2019

(30) Foreign Application Priority Data

Jan. 30, 2018  (JP) .............................. JP2018-013338

(51) Int. Cl.
*G06F 11/30* (2006.01)
*H01J 37/32* (2006.01)
(Continued)

(52) U.S. Cl.
CPC .... *H01J 37/32935* (2013.01); *G05B 23/0283* (2013.01); *H01L 21/31116* (2013.01);
(Continued)

(58) Field of Classification Search
CPC ............................................... H01J 37/32935
See application file for complete search history.

(56) References Cited

U.S. PATENT DOCUMENTS

| 6,151,532 A | 11/2000 | Barone et al. |
| 2002/0149317 A1 | 10/2002 | Nakano et al. |

(Continued)

FOREIGN PATENT DOCUMENTS

| CN | 102156443 A | 8/2011 |
| CN | 106298502 A | 1/2017 |

(Continued)

OTHER PUBLICATIONS

Taiwan Office Action dated Mar. 15, 2019 for TW 107127537.
(Continued)

*Primary Examiner* — Phuong Huynh
(74) *Attorney, Agent, or Firm* — Miles & Stockbridge, P.C.

(57) ABSTRACT

A plasma processing apparatus including a state prediction apparatus that predicts an apparatus state of the plasma processing apparatus configured to include an apparatus data recording unit that records apparatus data output from the plasma processing apparatus during the processing of the sample, a physical environment measurement data recording unit that measures physical environment in the processing chamber and records apparatus physical environment data, data correction unit that extracts a temporal change component of the physical environment from a plurality of the apparatus physical environment data recorded in the physical environment measurement data recording unit and extracts the temporal change component of the physical environment from the apparatus data to remove the temporal change components, and an apparatus state prediction calculation unit that predicts the state of the plasma processing apparatus using the apparatus data from which the temporal change component of the physical environment is removed as input data.

15 Claims, 6 Drawing Sheets

(51) Int. Cl.
    *G05B 23/02*   (2006.01)
    *H01L 21/67*   (2006.01)
    *H01L 21/311*  (2006.01)
    *G06N 20/00*   (2019.01)

(52) U.S. Cl.
    CPC .. *H01L 21/67069* (2013.01); *H01L 21/67253* (2013.01); *H01L 21/67288* (2013.01); *G06N 20/00* (2019.01)

(56) References Cited

U.S. PATENT DOCUMENTS

| | | | |
|---|---|---|---|
| 2003/0170984 | A1 | 9/2003 | Yamamoto et al. |
| 2004/0254761 | A1 | 12/2004 | Sakano et al. |
| 2005/0006344 | A1 | 1/2005 | Tanaka |
| 2005/0146709 | A1 | 7/2005 | Oh et al. |
| 2005/0154482 | A1* | 7/2005 | Tomoyasu ........ H01J 37/32935 700/108 |
| 2016/0293462 | A1 | 10/2016 | Matsushita |

FOREIGN PATENT DOCUMENTS

| | | | |
|---|---|---|---|
| CN | 106663625 | A | 5/2017 |
| JP | 200439952 | A | 2/2004 |
| JP | 2004-0349419 | A | 12/2004 |
| JP | 3709378 | A | 10/2005 |
| JP | 4570736 | B2 | 10/2010 |
| JP | 2016192532 | A | 11/2016 |
| JP | 2017-004827 | A | 1/2017 |
| TW | 492106 | B | 6/2002 |
| TW | 508693 | B | 11/2002 |
| TW | 200527256 | A | 8/2005 |
| WO | 2004019396 | A1 | 3/2004 |

OTHER PUBLICATIONS

Office Action dated Jul. 21, 2019 in corresponding Korean Application No. 10-2018-0083771.

Jouan-Rimbaud Bouveresse et al. "Independent component analysis as a pretreatment method for parallel factor analysis to eliminate artefacts from multiway data." Analytica Chimica Atca., Apr. 2007, vol. 589, issue 2, pp. 216-224.

Howley et al. "The Effect of Principal Component Analysis on Machine Learning Accuracy with High Dimensional Spectral Data" Applications and Innovations in Intelligent Systems XIII, Oct. 2005, pp. 209-222.

Office Action dated Apr. 6, 2021 in Japanese Application No. 2018-013338.

\* cited by examiner

ND PREDICTION APPARATUS OF THE
PLASMA PROCESSING APPARATUS AND PREDICTION APPARATUS OF THE CONDITION OF PLASMA PROCESSING APPARATUS

CLAIM OF PRIORITY

The present application claims priority from Japanese Patent Application JP 2018-13338 filed on Jan. 30, 2018, the content of which is hereby incorporated by reference into this application.

BACKGROUND OF THE INVENTION

The present invention relates to a plasma processing apparatus provided with a function that predicts a state of the apparatus by performing arithmetic processing using sensor data output from the plasma processing apparatus and a state prediction apparatus that predicts a state of a processing chamber in which a sample is subjected to plasma processing.

In a semiconductor device manufacturing process, various manufacturing processes such as lithography, film formation, and etching are performed repeatedly. In a semiconductor device mass production factory, suppressing a decrease in an operation rate of a semiconductor manufacturing apparatus performing these manufacturing processes is one of important issues in mass production cost reduction.

For example, in a plasma etching apparatus, a long term operation of the apparatus causes a temporal change inside a processing chamber due to accumulation of a reaction product and consumption of a part, deterioration of a component performing a plasma generation and control, and the like. Thus, periodic maintenance for regular part replacement and apparatus cleaning and apparatus maintenance performed as a response to an unexpected apparatus failure/malfunction and the like are performed.

Since any of these pieces of maintenance decrease the operation rate of the apparatus, a time for the apparatus maintenance is required to be a necessary minimum from a viewpoint of mass production cost. In order to reduce a cumulative time for the apparatus maintenance, the maintenance is required to be performed at the optimum timing with high efficiency by predicting soundness and life of each manufacturing apparatus and further specifying an apparatus part to be maintained in advance.

In the related art, in the plasma processing apparatus, as a method of monitoring an apparatus state and detecting/predicting an abnormality, following techniques have been proposed. For example, there are methods of determining an operation stop time by creating a reference model from an apparatus signal data group acquired during operation of apparatuses disclosed in Japanese Patent No. 4570736 and JP-A-2016-192532, calculating change degree (hereinafter, apparatus soundness index) from the model in the apparatus signal data acquired from an apparatus for state prediction, and providing a threshold for the apparatus soundness index.

In these methods, for input data used to calculate the models, soundness indexes, and thresholds, plasma emission spectroscopic measurement data, electrical signal data at optional points of the apparatuses such as control signals and response signals of sensors and components, and the like are used.

SUMMARY OF THE INVENTION

However, in the raw data group acquired from these apparatuses, in many cases, a change component that gives only a negligible change to the plasma processing result, but gives a large change to the data is included.

For example, a change component caused by the change in the physical environment of the apparatus such as consumption of an inner wall of the apparatus can be mentioned. In particular, it is an emission intensity change component caused by change in roughness, change in a film thickness and change in a quartz fogging amount in a quartz window installed for light introduction of spectroscopic measurement and a quartz cover installed to cover the inner wall of the plasma processing apparatus in the plasma emission measurement data, a plasma impedance change component caused by change in a film thickness of an insulating film layer formed in the inner wall portion of the grounded apparatus in plasma impedance data, and the like.

That is, in a case of calculating the models, thresholds, and apparatus soundness indexes for performing state prediction of the aforementioned plasma processing apparatuses using the raw data group acquired from these apparatuses as input data, it is difficult to accurately predict the state change affecting the plasma processing result as a prediction target. Therefore, there is a need to cancel (remove) the change component accompanied with physical environment change of the apparatus.

In the related art, a technique of correcting a value by standardizing for each data of an optional section as described in International Publication No. WO2004-19396A1. As described in Japanese Patent No. 3709378, a method of detecting attenuation of light caused by the quartz fogging from difference in light quantity between reference light of external light acquired in advance and external light acquired at any apparatus state, and correcting the plasma emission spectroscopic measurement data acquired at any apparatus state from the attenuation of light in the plasma processing apparatus provided with the external light that transmits a light introduction quartz window for plasma emission spectroscopic measurement and a quartz cover that covers an inner wall of the apparatus is disclosed.

However, in the technique disclosed in International Publication No. WO2004-19396A1, since the change caused in the optional section is discretely corrected, it is not appropriate for removing continuously occurring temporal change component. In the technology disclosed in Japanese Patent No. 3709378, since correction is performed for each data point, there is a problem that the generated correction error can be a new variation for each data point. The generated correction error is a new disturbance for the continuous temporal change component, and new devices are required to prevent (or reduce) generation of the correction error for each data point in practical use. That is, in order to predict the apparatus state with high accuracy, a method and a system that capture the continuous temporal change component of the physical environment change and remove only the change component from the input data for model creation, threshold calculation, and soundness index calculation.

The present invention is made to solve the problems described above, and an object of the present invention is to provide, in a plasma processing apparatus, the plasma processing apparatus capable of detecting an apparatus abnormality affecting plasma processing result as a prediction target with high accuracy and accurately predicting a time when maintenance is required, and a state prediction apparatus that predicts a state of a plasma processing chamber in which a sample is subjected to plasma processing by capturing a continuous temporal change component of physical environment change in the plasma apparatus, canceling (removing) only the change component from input data in prediction of the apparatus state, and calculating a reference model for prediction, a threshold for determining the abnormality, and a soundness index indicating the apparatus state.

The above-described object can be achieved with the plasma processing apparatus including the processing chamber in which a sample is subjected to the plasma processing and the state prediction apparatus that predicts the state of the processing chamber in which the state prediction apparatus is configured to remove the temporal change component of the physical environment of the processing chamber from first data monitored during the plasma processing and perform an operation to predict the state of the processing chamber using the first data from which the temporal change component is removed as input data, and the temporal change component is extracted from second data indicating the physical environment of the processing chamber.

The above-described object can be achieved with the state prediction apparatus that predicts the state of the processing chamber in which a sample is subjected to the plasma processing including an arithmetic unit that performs the operation to predict the state of the processing chamber using first data, monitored during the plasma processing, from which a temporal change component of the physical environment of the processing chamber is removed as input data, in which the temporal change component is extracted from second data indicating the physical environment of the processing chamber.

According to the present invention, in the plasma processing apparatus including the processing chamber for processing a sample, it is possible to capture the continuous temporal change component in physical environment change of the apparatus that does not affect the plasma processing result but greatly affects the data acquired from the apparatus, to remove only the change component from the input data in calculation for performing the apparatus state prediction, and to improve the prediction accuracy of the apparatus state. According to the present invention, in the plasma processing apparatus, it is possible to detect the apparatus abnormality that affects the plasma processing result as the prediction target with high accuracy, and accurately predict a time for maintenance.

DETAILED DESCRIPTION OF THE INVENTION

Figure 1:
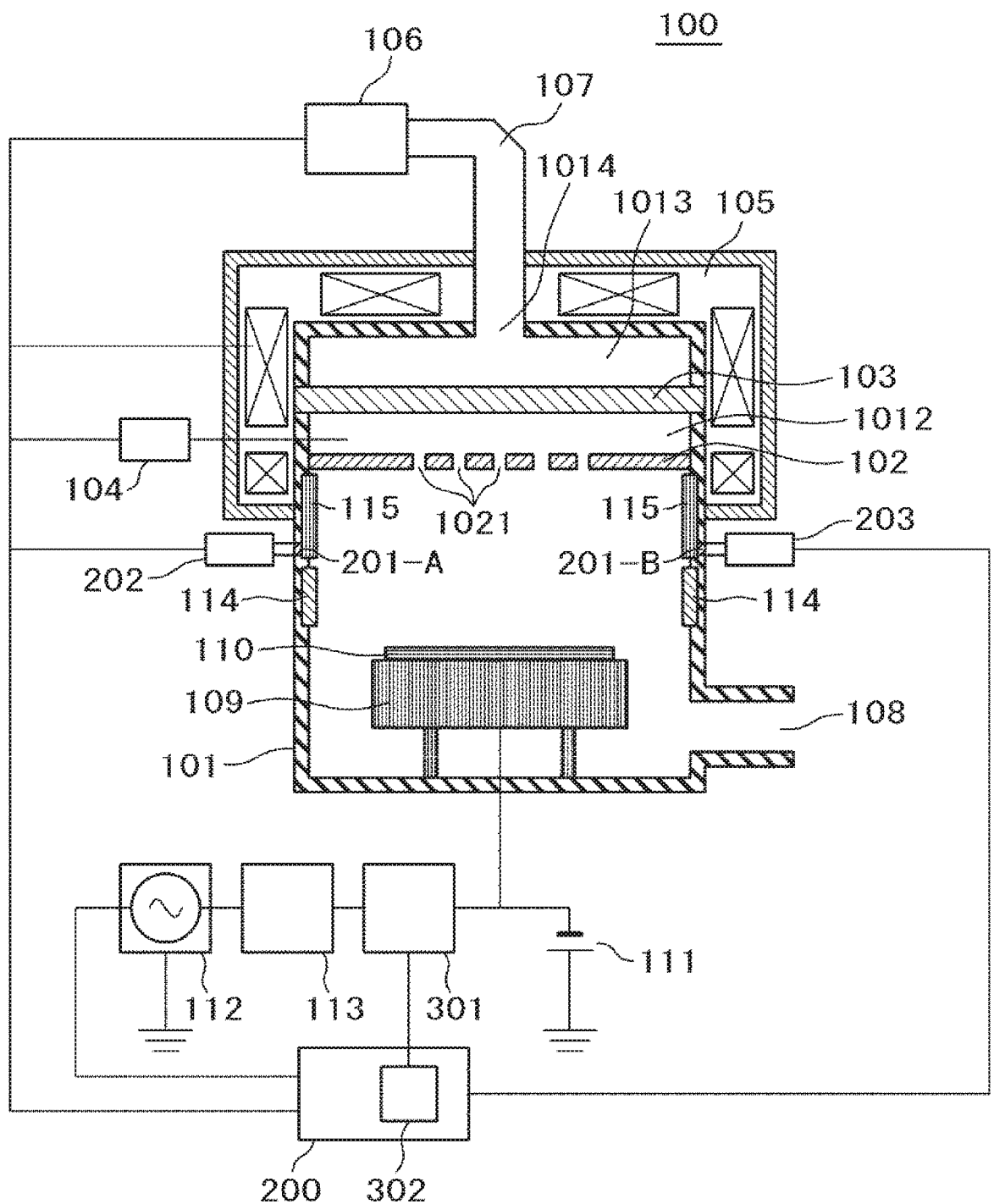
FIG. 1 is a block diagram of a longitudinal section for explaining a configuration of a plasma processing apparatus according to an embodiment of the present invention.

The present invention relates to a plasma processing state prediction apparatus including a plasma processing apparatus that processes a sample by generating plasma in an airtight processing chamber and a state prediction apparatus that predicts an apparatus state of the plasma processing apparatus. The state prediction apparatus is configured to include an apparatus data recording unit that records apparatus data output from the plasma processing apparatus during the plasma processing apparatus is processing the sample, a physical environment measurement data recording unit that measures physical environment inside the processing chamber and records as apparatus physical environment data, a data correction unit that extracts a temporal change component of the physical environment from a plurality of apparatus physical environment data recorded in the physical environment measurement data recording unit, and extracts and removes the temporal change component of the physical environment from the apparatus data recorded in the apparatus data recording unit, and an apparatus state prediction calculation unit that performs calculation to predict the apparatus state of the plasma processing apparatus using the apparatus data from which the temporal change component of the physical environment is removed as input data.

The present invention relates to a plasma processing state prediction apparatus including a plasma processing apparatus that includes a processing chamber provided with a sample stage inside and processes a sample placed on the sample stage with plasma that is generated inside the processing chamber, and a state prediction apparatus that predicts the apparatus state of the plasma processing apparatus. The state prediction apparatus is configured to include a data recording unit that records a plurality of apparatus physical environment data acquired by measuring by changing the physical environment inside the processing chamber and the apparatus data output from the plasma processing apparatus during the processing the sample by the plasma processing apparatus, a data correction unit that extracts and removes the continuous temporal change component of the apparatus physical environment change that does not affect the plasma processing result by the plasma processing apparatus but greatly affects the apparatus data acquired from the plasma processing apparatus from the apparatus data using the plurality of apparatus physical environment data and the apparatus data recorded in the data recording unit, an apparatus state prediction unit that predicts an apparatus abnormality that affects the plasma processing result of the plasma processing apparatus using the apparatus data from which the continuous temporal change component of the apparatus physical environment is removed, and a determination/control apparatus that outputs information that warns the abnormality of the plasma processing apparatus in a case where the apparatus state prediction unit predicts the apparatus abnormality in the plasma processing apparatus.

In the present invention, the above-described plasma processing state prediction apparatus is configured to include a physical environment change component extraction unit that constructs a principal component space for the plurality of apparatus physical environment data by performing principal component analysis on the data correction unit using the plurality of apparatus physical environment data, a physical environment component removal unit that removes the temporal change component of the physical environment from the apparatus data by projecting the apparatus data recorded in the apparatus data recording unit on the principal component space to remove a first principal component or a plurality of principal components from the top from the apparatus data projected on the principal component space and to be returned to an original data space.

In the present invention, in the plasma processing state prediction apparatus provided with the above-described data correction unit, the processing chamber includes a pair of light transmission windows at opposite positions, an external light irradiation unit that emits external light inside the processing chamber from a light transmission window on one side between the pair of light transmission windows, and a spectroscopic measurement unit that spectroscopically measures the external light transmitted through a light transmission window on the other side between the pair of the light transmission windows in the external light emitted from the external light irradiation unit, transmitted through the light transmission window on one side and entered inside the processing chamber. The spectroscopic measurement data on a plurality of external lights acquired by repeatedly spectroscopically measuring the external light emitted from the external light irradiation unit in a state that plasma is not generated inside the processing chamber with the spectroscopic measurement unit by changing the conditions inside the processing chamber is the apparatus physical environment data to be recorded in the physical environment measurement data recording unit. The plasma emission spectroscopic measurement data acquired by spectroscopically measuring with the spectroscopic measurement unit when the plasma is generated inside the processing chamber and the sample is processed is the apparatus data to be recorded in the apparatus data recording unit.

In the present invention, in the plasma processing state prediction apparatus including the above-described data correction unit, the processing chamber has a quartz cover installed so as to cover an inner wall of the processing chamber, one pair of transmission windows provided at opposite positions, an spectroscopic measurement unit that microscopically measures the light transmitted through one of the transmission windows between the pair of transmission windows, and the external light irradiation unit that emits external light inside the processing chamber from the other transmission window between the pair of the transmission windows. The spectroscopic measurement data of the plurality of external lights acquired by changing any of the quartz fogging amount, surface roughness, or a thickness of the quartz cover or the pair of transmission windows with the spectroscopic measurement unit in a state that the plasma is not generated inside the processing chamber is the apparatus physical environment data to be recorded in the physical environment measurement data recording unit. The plasma emission spectroscopic measurement data acquired by the spectroscopic measurement unit in the state that the plasma is not generated inside processing chamber is the apparatus data to be recorded in the apparatus data recording unit.

In the present invention, in the plasma processing state prediction apparatus including the above-described data correction unit, the processing chamber has a quartz cover installed so as to cover the inner wall of the processing chamber, one pair of transmission windows provided at opposite positions, an spectroscopic measurement unit that microscopically measures the light transmitted through one of the transmission windows between the pair of transmission windows, and an external light irradiation unit that emits external light inside the processing chamber from the other transmission window between the pair of the transmission windows. The plasma emission spectroscopic measurement data of the spectroscopic measurement data acquired by plasma processing a sample while an initial quartz cover is mounted inside the processing chamber and spectroscopically measuring the plasma emission during the plasma processing with spectroscopic measurement unit and the plasma emission spectroscopic measurement data of the spectroscopic measurement data acquired by, using a plurality of quartz covers thinned by different thicknesses with respect to the initial quartz cover in place of the initial quartz cover, spectroscopically measuring the plasma emission during the plasma processing of the sample for each quartz cover having different thicknesses with the plasma emission spectroscopic measurement unit are the apparatus physical environment data to be recorded in the physical environment measurement data recording unit. The plasma emission spectroscopic measurement data acquired by spectroscopically measuring with the spectroscopic measurement unit each plasma processing when plasma processing in which plasma is generated inside the processing chamber while a predetermined quartz cover is mounted inside the processing chamber is carried out by replacing the samples one by one is the apparatus data to be recorded in the apparatus physical environment data recording unit.

In the present invention, in the plasma processing state prediction apparatus including the above-described data correction unit, the plasma processing apparatus includes a substrate electrode disposed inside the processing chamber, a radio frequency power supply that applies radio frequency power to the substrate electrode from outside the processing chamber, a voltage/current probe that measures a radio frequency current value or a voltage value of the radio frequency power applied to the substrate electrode from the radio frequency power supply between the radio frequency power supply and the substrate electrode, and an impedance arithmetic unit that calculates plasma impedance from the measurement value acquired by measuring the radio frequency current value or the voltage value by the voltage/current probe. The plasma impedance calculated by the impedance arithmetic unit from the measurement value acquired by measuring the radio frequency current value or the voltage value of the radio frequency power with the voltage/current probe applied to the substrate electrode from the radio frequency power supply during the plasma processing the sample placed on the substrate electrode by generating inside the processing chamber while the initial quartz cover is mounted inside the processing chamber, and the plasma impedance calculated by the impedance arithmetic unit from the measurement value acquired by measuring the radio frequency current value or the voltage value of the radio frequency power applied to the substrate electrode from the radio frequency power supply, using a plurality of quartz covers thinned by different thicknesses with respect to the initial quartz cover in place of the initial quartz cover, during the plasma processing of the sample for each quartz cover having different thicknesses are the apparatus physical environment data to be recorded in the physical environment measurement data recording unit. The plasma impedance calculated by the impedance arithmetic unit from the measurement value acquired by measuring the radio frequency current value or the voltage value of the radio frequency power with the voltage/current probe applied to the substrate electrode from the radio frequency power supply during the plasma processing the sample by generating the plasma inside the processing chamber while a predetermined quartz cover is mounted inside the processing chamber is the apparatus data to be recorded in the apparatus data recording unit.

Embodiments of the present invention will be described below with reference to the drawings.

The plasma processing state prediction apparatus according to the embodiment of the present invention will be described with reference to FIGS. 1 to 6.

First, an example of a plasma etching apparatus that has a configuration excluding a state prediction apparatus 600 which is a portion of the plasma processing apparatus according to the present invention will be described using FIG. 1. FIG. 1 is a longitudinal section diagram for explaining a configuration of a microwave electron cyclotron resonance (ECR) plasma etching apparatus which is an example of a plasma etching apparatus 100 according to the present embodiment, and schematically showing a substrate electrode 109 installed inside a processing chamber 101, a supply apparatus of an electric field (magnetron 106) and a supply apparatus of a magnetic field (solenoid coil 105), and a radio frequency power supply 112 installed outside a vacuum container forming the processing chamber 101, and a control apparatus 200. A device and an apparatus other than those described above can be disposed or removed according to a required performance or specification so as not to significantly impair an operation and an effect of the invention according to the embodiment by a person having ordinary knowledge in a technical field according to the embodiment.

In the plasma etching apparatus 100 shown in FIG. 1, a disk-shaped shower plate 102 formed of a conductor having a plurality of opening parts 1021 for introducing a reactive gas and a dielectric window 103 (for example, made of quartz) are disposed above the processing chamber 101 having a cylindrical shape with an open upper top, and an inside of the processing chamber 101 is sealed hermetically by the dielectric window 103. A flow rate of the reactive gas is controlled by a gas supply apparatus 104, and the reactive gas is supplied to the processing chamber 101 via the shower plate 102. On the outer circumference and above the processing chamber 101, solenoid coils 105 that form the magnetic field inside the processing chamber 101 are disposed, and it is possible to control the magnetic field formed inside the processing chamber 101 by the current of the solenoid coils 105.

At the open upper part of the processing chamber 101, the magnetron 106 that generates electromagnetic wave and a waveguide 107 (or an antenna) that transmits the electromagnetic wave are installed, and are connected to a cylindrical space 1013 disposed above the dielectric window 103 via an opening part 1014. The electromagnetic wave used in the present embodiment is a microwave of 2.45 GHz by the magnetron 106, but this is not limited particularly by the effect and the operation.

A cavity resonator is formed by the cylindrical space 1013 formed at the upper part of the dielectric window 103 and a space 1012 inside the processing chamber 101 partitioned by the dielectric window 103 and the disk-shaped shower plate 102 formed of the conductor. In the cavity resonator configured by the space 1013, the dielectric window 103, and the space 1012, a space that satisfies conditions for resonating the microwave introduced from the opening part 1014 is formed.

A vacuum evacuation pump (not shown) is connected to the lower part of the processing chamber 101 through a vacuum evacuation pipe 108 so that the inside of the processing chamber 101 partitioned by the dielectric window 103 can be evacuated. The substrate electrode (sample stage) 109 installed at the lower part of the processing chamber 101 so as to face the shower plate 102 at the upper part of the processing chamber 101 has an upper surface covered with a dielectric film (not shown).

A sample (wafer) 110 is transported to the inside of the processing chamber 101 by a transportation apparatus such as a robot arm (not shown). Then, the sample is mounted on the substrate electrode 109 and is electrostatically attracted to a dielectric film (not shown) that covers the upper surface of the substrate electrode 109 by a DC voltage applied to an electrode (not shown) formed inside the dielectric film that covers the upper surface of the substrate electrode 109 from a DC power supply 111. The radio frequency power supply 112 can apply radio frequency power to the substrate electrode 109 via a radio frequency matching device 113. An earth 114 connected to a ground is installed in the middle of the processing chamber 101, and the radio frequency current applied on the substrate electrode 109 by the radio frequency power supply 112 flows in the earth 114 via plasma.

The processing chamber 101 has a through-hole filled with a quartz window 201-A, and an external light source 202 is installed outside. The processing chamber 101 has the same through-hole also at the diagonal of the through-hole in which the quartz window 201-A of the processing chamber 101 is disposed, and the through-hole is filled with a quartz window 201-B. The external light emitted from the external light source 202 transmits through the quartz window 201-A and enters the inside of the processing chamber 101, and a portion of the external light transmits through the quartz window 201-B that is provided on the opposite side and is measured by a spectroscopic measurement device 203. The spectroscopic measurement device 203 can spectroscopically measure the plasma emission by the plasma generated inside the processing chamber 101 in addition to the external light emitted from the external light source 202.

A voltage/current probe (V/I probe) 301 that can measure a radio frequency current value or a voltage value is connected between the radio frequency power supply 112 and the substrate electrode 109, and is connected to an impedance arithmetic unit 302 that calculates plasma impedance from the measurement value inside the control apparatus 200.

The gas supply apparatus 104, the solenoid coil 105, the magnetron 106, the radio frequency power supply 112, the external light source 202, and the spectroscopic measurement device 203 are connected with the control apparatus 200.

The etching processing in the plasma etching apparatus 100 described above is started in the following flow.

First, the vacuum evacuation pump (not shown) is operated under the control of the control apparatus 200 and the inside of the processing chamber 101 is evacuated. When the pressure inside the processing chamber 101 reaches a predetermined degree of vacuum (pressure), the gas supply apparatus 104 is operated by the control apparatus 200 so that a process gas is introduced from the gas supply apparatus 104 into the processing chamber 101 and the inside of the processing chamber 101 is controlled to a desired pressure.

The control apparatus 200 controls the magnetron 106 in this state to generate a magnetic field with intensity that satisfies ECR condition for the electromagnetic wave (microwave) supplied from the magnetron 106 at a space between the shower plate 102 and the wafer 110 mounted on the substrate electrode 109 inside of the processing chamber 101.

Next, the control apparatus 200 controls the magnetron 106 to generate the electromagnetic wave (microwave) from the magnetron 106. The microwave oscillated from the magnetron 106 propagates inside the waveguide 107, and is introduced to the inside of the cavity resonator formed by the cylindrical space 1013 formed at the upper part of the dielectric window 103 and the space 1012 inside the processing chamber 101 partitioned by the dielectric window 103 and the disk-shaped shower plate 102 formed of the conductor from the opening part 1014. In the cavity resonator configured by the space 1013, the dielectric window 103, and the space 1012, a space that satisfies conditions for resonating the microwave introduced from the opening part 1014 is formed.

The microwave resonated and amplified inside the cavity resonator is propagate from a plurality of opening parts 1021 formed in the shower plate 102 to the inside of the processing chamber 101, in the magnetic field formed inside the processing chamber 101, excites the process gas for processing supplied to the inside of the processing chamber 101 from the gas supply apparatus 104, and generates the plasma with a relatively high density by the electron cyclotron resonance (ECR).

On the other hand, in the substrate electrode 109, radio frequency power is applied from the radio frequency power supply 112 controlled by the control apparatus 200, an ion is drawn from the plasma with the process gas for processing generated inside the processing chamber 101 to the upper surface of the wafer 110 mounted on the substrate electrode 109, and thereby the etching processing is performed on the surface of the wafer 110.

The present invention is not limited to the above-described embodiments, and various modifications are included. For example, in the present embodiment described above, the embodiment of the ECR plasma apparatus is particularly described. However, the present invention has the same effect even when another plasma generating apparatus or method, for example, inductively coupled plasma (ICP) or capacitively coupled plasma (CCP) is used. The embodiments described above are described in detail for describing the present invention in an easily understandable manner, and are not necessarily limited to those including all the configurations described. It is possible to add/remove/replace a part of the configurations of the present embodiment described above.

Figure 2:
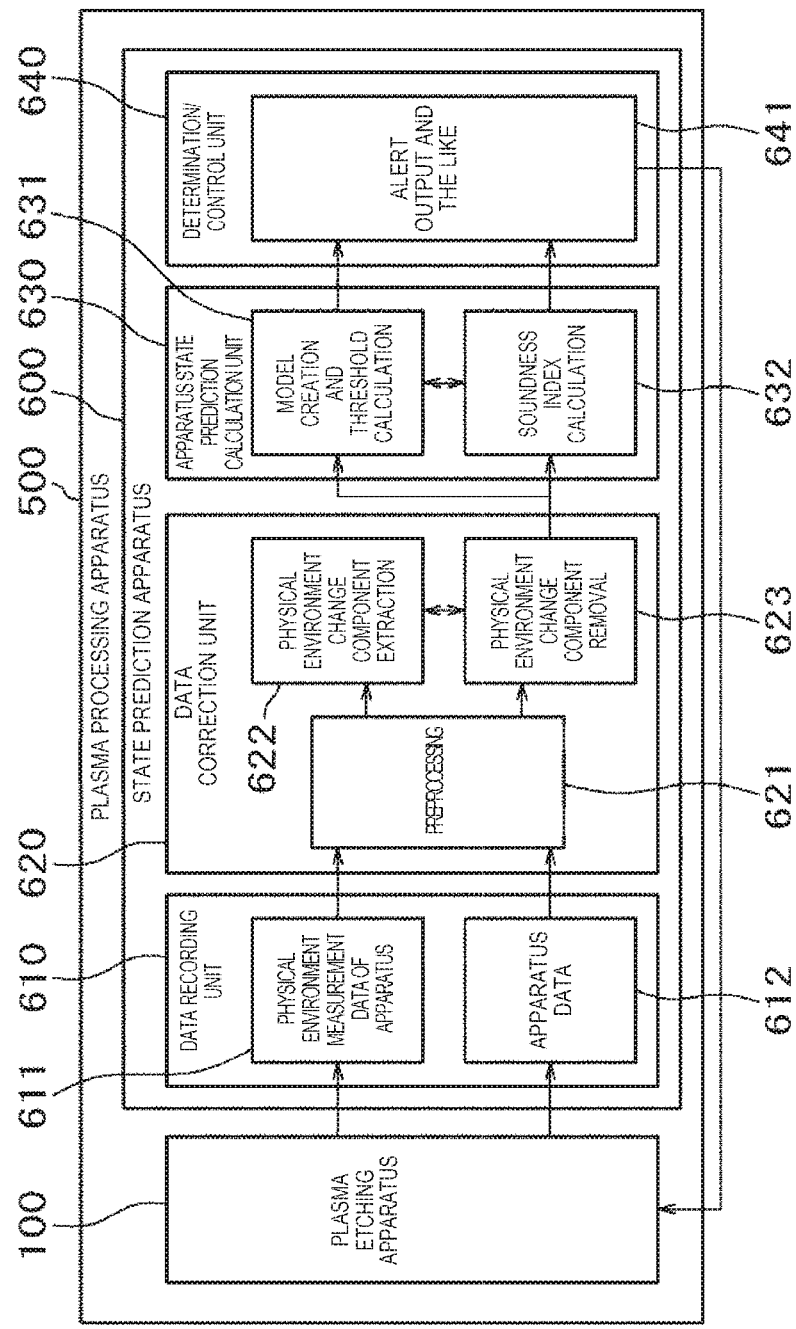
FIG. 2 is a block diagram showing an overall configuration of a plasma processing state prediction apparatus according to the embodiment of the present invention.

FIG. 2 shows a configuration of a plasma processing apparatus 500 according to the embodiment of the present invention. The plasma processing apparatus 500 according to the present embodiment is configured with the plasma etching apparatus 100 that processes the wafer 110 and has the configuration described in FIG. 1, and the state prediction apparatus 600 that predicts the state of the plasma etching apparatus 100 from information obtained during the operation of the plasma etching apparatus 100.

The state prediction apparatus 600 includes a data recording unit 610, a data correction unit 620, an apparatus state prediction calculation unit 630, and a determination/control unit 640.

The data recording unit 610 includes a physical environment measurement data recording unit 611 that records apparatus physical environment data of the plasma etching apparatus 100, and an apparatus data recording unit 612 that records the apparatus data.

The data correction unit 620 includes a preprocessing unit 621 that performs preprocessing on the apparatus physical environment data recorded in the physical environment measurement data recording unit 611 of the data recording unit 610 and the apparatus data recorded in the apparatus data recording unit 612, a physical environment change component extraction unit 622 that extracts the physical environment change component from an apparatus physical environment data group of the plasma etching apparatus 100 preprocessed in the preprocessing unit 621, and a physical environment change component removing unit 623 that removes the physical environment change component of the apparatus data of the plasma etching apparatus 100 preprocessed in the preprocessing unit 621 using information on the physical environment change component extracted by the physical environment change component extraction unit 622.

The apparatus state prediction calculation unit 630, which is an arithmetic unit, includes a model creation and threshold calculation unit 631 that creates a model and calculates a threshold for performing the state prediction of the plasma etching apparatus 100 using a corrected data group from which the physical environment change component of the apparatus data of the plasma etching apparatus 100 is removed in the physical environment change component removing unit 623 of the data correction unit 620, and a soundness index calculation unit 632 that calculates a soundness index of the plasma etching apparatus 100 using the corrected data group from which the physical environment change component of the apparatus data of the plasma etching apparatus 100 is removed by the physical environment change component removing unit 623 of the data correction unit 620 and a threshold calculated in the model creation and threshold calculation unit 631.

The determination/control unit 640 includes an output unit 641 that determines the state of the plasma etching apparatus 100 using the threshold calculated in the model creation and threshold calculation unit 631 of the apparatus state prediction calculation unit 630 and the soundness index of the plasma etching apparatus 100 calculated by the soundness index calculation unit 632 and outputs a signal for performing apparatus control predetermined by the result.

Figure 3:
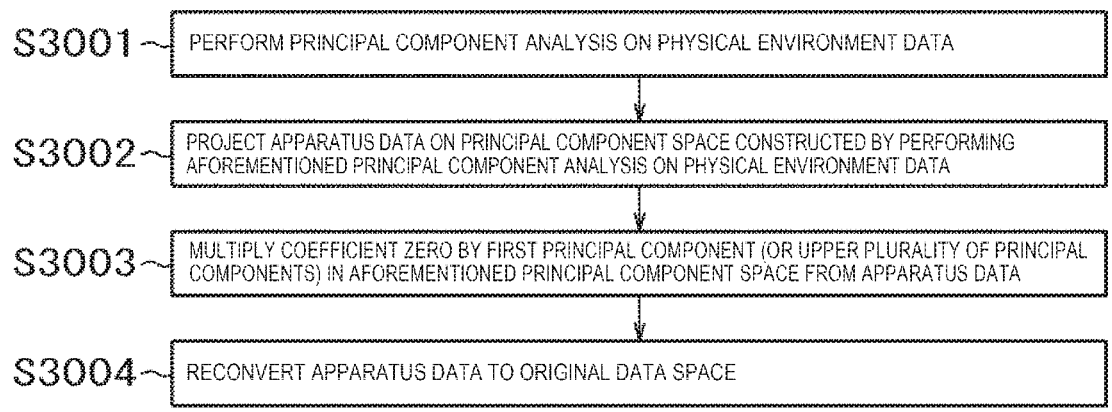
FIG. 3 is a flowchart showing a principle of a sequence for removing a physical environment component according to the embodiment of the present invention.

The flowchart shown in FIG. 3 is a diagram for explaining the principle of the present embodiment, and indicates a physical environment change component removal sequence executed by the data correction unit 620 in the state prediction apparatus 600 of the plasma processing apparatus 500. The sequence for explaining the principle of the present embodiment shown in FIG. 3 indicates a calculation sequence that extracts the physical environment change component from the apparatus physical environment data group, and removes the physical environment change component of the apparatus data in the case of using the principal component analysis.

First, as a first step, the physical environment change component extraction unit 622 performs principal component analysis on the apparatus physical environment data using the data acquired by preprocessing the apparatus physical environment data recorded in the physical environment measurement data recording unit 611 by the preprocessing unit 621 to construct a principal component space (S3001).

Next, as a second step, the physical environment change component extraction unit 622 projects the apparatus data preprocessed with the preprocessing unit 621 on the principal component space constructed by the principal component analysis on the apparatus physical environment data in S3001 (S3002).

As a third step, in the physical environment change component removing unit 623, a first principal component (or plurality of principal components from top) in the principal component space is multiplied by a coefficient zero from the apparatus data projected on the principal component space in S3002 using the data acquired by preprocessing the apparatus data recorded in the apparatus data recording unit 612 by the preprocessing unit 621 (S3003).

As a fourth step, the physical environment change component removing unit 623 reconverts the apparatus data to the original data space (S3004).

The apparatus data of the plasma etching apparatus 100 recorded in the apparatus data recording unit 612 of the data recording unit 610 is the electrical signal data obtained at any point during the operation of the plasma etching apparatus 100 and the plasma emission spectroscopic measurement data acquired by measurement with the spectroscopic measurement device 203 during the plasma processing.

In the present embodiment, the case where the apparatus data is the plasma emission spectroscopic measurement data will be described as an example. Since the data types of the apparatus data recorded in the apparatus data recording unit 612 and the apparatus physical environment data recorded in the physical environment measurement data recording unit 611 need to be the same, in a case where the apparatus data recorded in the apparatus data recording unit 612 is the emission spectroscopic measurement data detected by the spectroscopic measurement device 203, the apparatus physical environment data recorded in the physical environment measurement data recording unit 611 is similarly the emission spectroscopic measurement data detected by the spectroscopic measurement device 203.

The measurement value of the emission spectroscopic measurement data detected by the spectroscopic measurement device 203 temporally changes due to the state change in the part consumption of the processing chamber 101. For example, in the quartz window 201-B for introducing light to the spectroscopic measurement device 203 installed outside the processing chamber 101 and a quartz cover 115 installed so to cover the inner wall of the processing chamber 101, the emission spectroscopic measurement data detected by the spectroscopic measurement device 203 changes as the quartz fogging amount, roughness, and the film thickness temporally changes.

Since these quartz change components do not affect the plasma etching result, in the case of performing the apparatus state prediction with high accuracy, it is necessary to be removed (canceled) from the measurement data recorded in the data recording unit 610.

Figure 4:
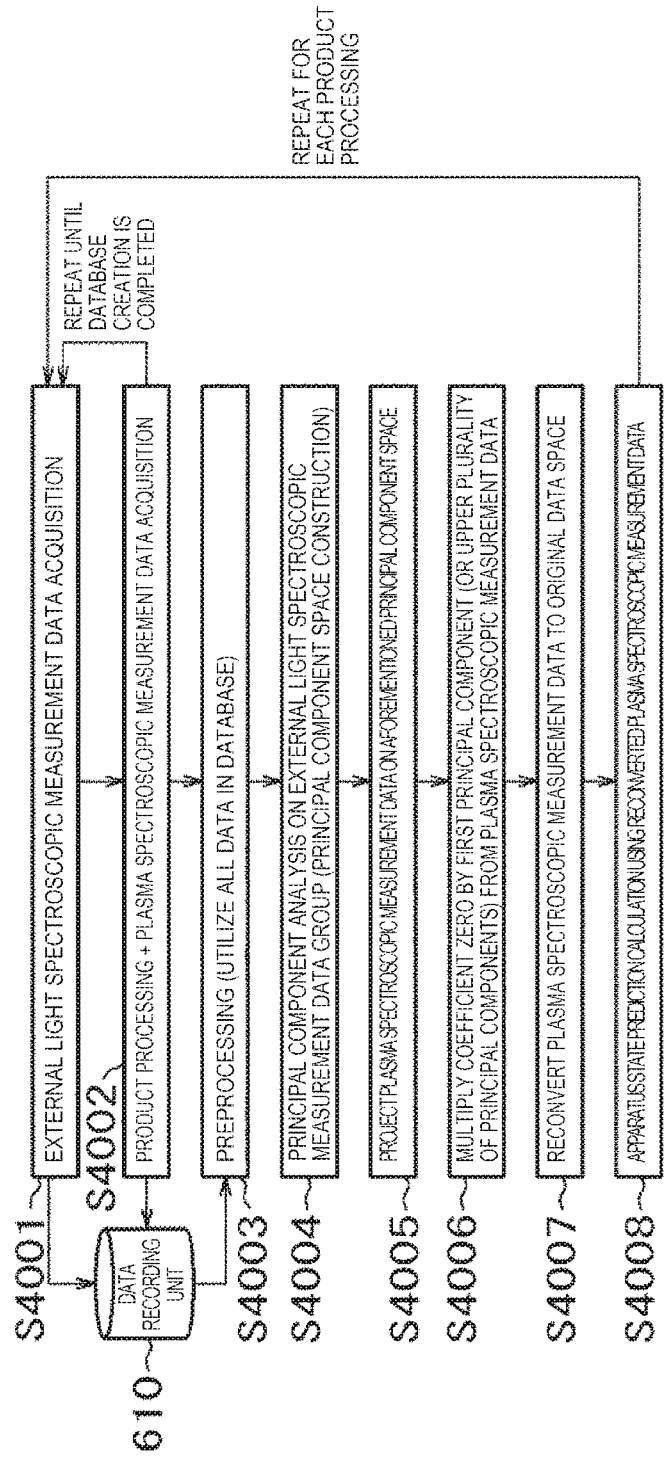
FIG. 4 is a flowchart showing measurement of quartz surface change and a removal sequence of a quartz surface change component according to the embodiment of the present invention.
Figure 5:
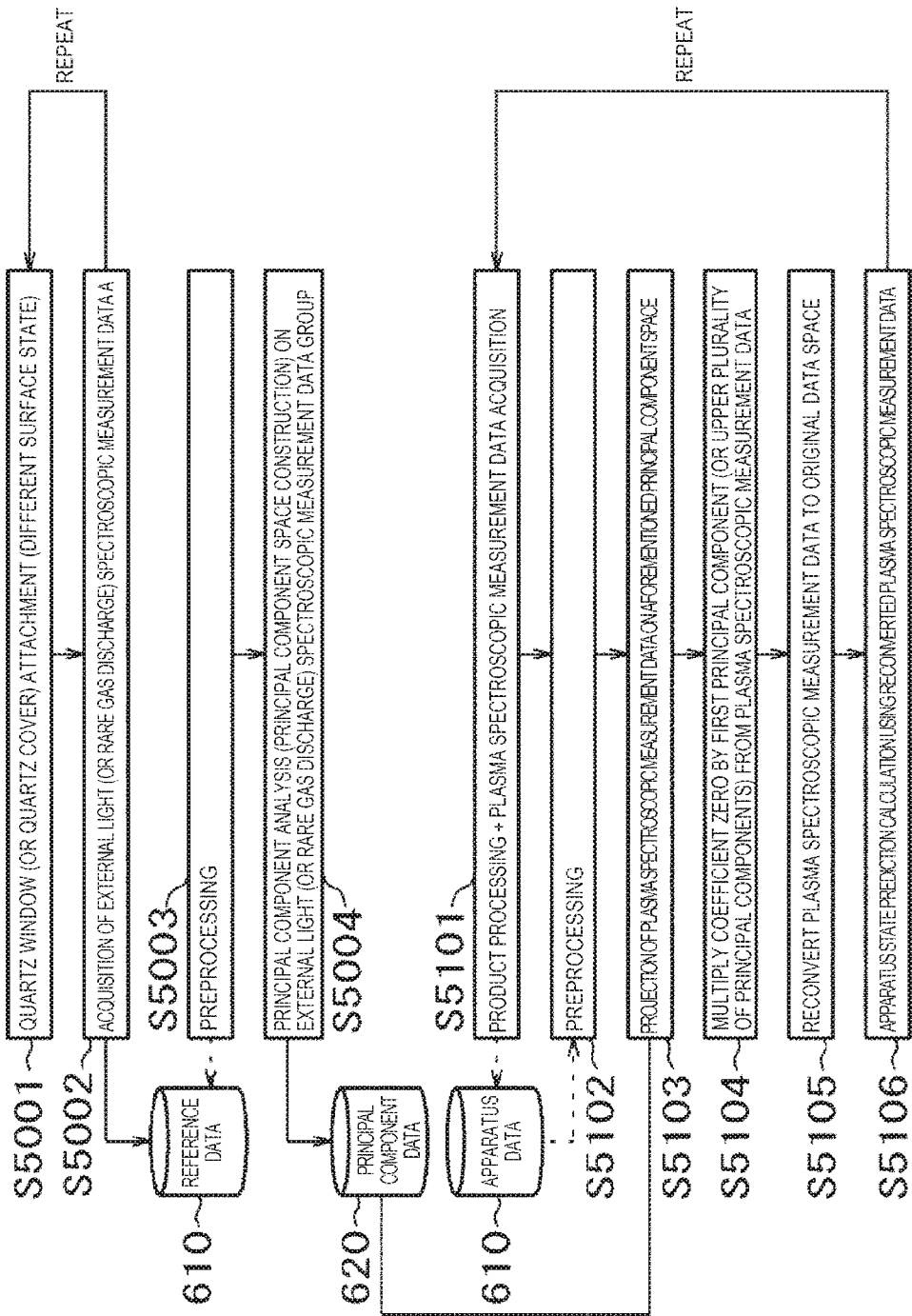
FIG. 5 is a flowchart showing a modification example of the measurement of the quartz surface change and the removal sequence of the quartz surface change component according to the embodiment of the present invention.

In the plasma processing apparatus 500 according to the present embodiment, in addition to the process flow explained with the principle of the present embodiment explained in FIG. 3, the temporal change components of the quartz surface state included in the apparatus data are removed by the method shown in FIG. 4 or the method of a modification example shown in FIG. 5.

In the measurement of the quartz surface change and the removal sequence of the quartz surface change component using the external light according to the present embodiment shown in the flowchart of FIG. 4, first, the external light emitted from the external light source 202 installed outside the processing chamber 101 and transmitted through the quartz window 201-A is introduced to the inside of the processing chamber 101 in the time when the plasma etching apparatus 100 is not performing the plasma processing, that is, the state in which the plasma is not generated inside the processing chamber 101, the light transmitted through the quartz window 201-B is received and spectroscopically measured by the spectroscopic measurement device 203, and records the spectroscopic measurement data as the apparatus physical environment data of the apparatus in the physical environment measurement data recording unit 611 of the apparatus (S4001). It is preferable that the light source used as the external light source 202 has a light component (wavelength component) the same as (or similar to) the plasma emission generated by the processing chamber 101, and it is appropriate to include light of 100 nm to 1,000 nm as the wavelength of plasma emission.

Thereafter, in the state that the external light source 202 is shut off, plasma is generated inside the processing chamber 101, the plasma processing is performed on the wafer 110, the light transmitted through the quartz window 201-B in the plasma emission during the processing is received and spectroscopically measured by the spectroscopic measurement device 203, and the spectroscopic measurement data is recorded in the apparatus data recording unit 612 as the apparatus data (S4002).

These are repeated a plurality of times to measure a plurality of apparatus physical environment data and apparatus data. These data includes temporal change component resulting from change in accumulation of a reaction product and change in temperature caused by a plurality of repeated processes or the change in the film thickness or the surface state of the quartz window 201-B and the quartz cover 115.

The measured apparatus physical environment data and the apparatus data are recorded and stored in the physical environment measurement data recording unit 611 or the apparatus data recording unit 612 of the data recording unit 610, respectively. The apparatus physical environment data and the apparatus data acquired by methods shown in (S4001) and (S4002) in advance may be stored in the data recording unit 610. In this case, in the processing chamber 101 in which the quartz windows 201-A and 201-B, and the quartz cover 115 in which the state change in the film thickness, occurrence of the roughness, or change in surface state such as fogging did not occur are installed, it is preferable that the apparatus physical environment data and the apparatus data acquired by starting the process from the apparatus whose apparatus state is known to be sound are stored.

In the case of storing such a prior data set, it is preferable to start the data record indicated in (S4001) and (S4002) from the apparatus state the same with (or similar to) the apparatus state in which the prior data set acquired.

Next, preprocessing is performed in the preprocessing unit 621 of the data correction unit 620 for the apparatus physical environment data and the apparatus data stored in the data recording unit 610 (S4003). The preprocessing performed in the preprocessing unit 621 is removal of outliers, extraction of a feature value, and standardization processing.

As a feature value to be extracted, frequency components acquired by Fourier transform or statistics or such as standard deviation, mean, variance, kurtosis, crest factor, skewness, and the like are used.

The standardization processing is a process of subtracting each data point by an average of the same type data group and dividing by each standard deviation of the data group, and by standardizing, it is possible to convert each data point so that the average value of the data group is zero and the standard deviation is one. For the apparatus physical environment data and the apparatus data, standardization processing of the same method as extraction of the same kind and the same number of feature values needs to be performed.

Thereafter, in the physical environment change component extraction unit 622, principal component analysis is performed on the external light spectroscopic measurement data group, that is, the apparatus physical environment data preprocessed in S4003, and construct the principal component space (S4004: corresponds to S3001 in FIG. 3).

Generally, the principal component analysis is an unsupervised algorithm that can reduce a dimension of data while maintaining information in a direction with a large variance for the data. The direction with the large variance is referred to as a principal component (PCs), and it is possible to represent data existing in a high dimensional space in a low dimensional space without avoiding loss of the information by reconstructing the data based on the principal component.

$$X = t_1 p_1^T + t_2 p_2^T + t_k p_k^T + E \quad \text{(Formula 1)}$$
$$= \sum_{i=1}^{k} t_i p_i^T + E$$
$$= \hat{X} + E$$

That is, as shown in an equation (Formula 1), the PCA decomposes matrix data X as a sum of PC scores $t_1$ and PC loadings
$p_1$ plus a residual matrix E.
X is a matrix that preserves directions with larger fractions.

$$\text{cov}(X) = \begin{pmatrix} \text{cov}(x_1, x_1) & \cdots & \text{cov}(x_1, x_k) \\ \vdots & \ddots & \vdots \\ \text{cov}(x_k, x_1) & \cdots & \text{cov}(x_k, x_k) \end{pmatrix} \quad \text{(Formula 2)}$$

Mathematically, the PCA executes an eigenvector decomposition of a variance/covariance matrix (X) shown in an equation (Formula 2).
In $X \in R^{m \times n}$, m is the number of samples stored as a row vector and n is a process variable (n<<m) stored as a column vector. The cov (X) is the variance/covariance matrix of k rows and k columns. In a case where each variable is normalized as an average value of zero and standard deviation of one, cov (X) means a correlation matrix.

In algebra, the eigenvector of a square matrix means a vector in which a direction is maintained in a linear transformation as shown in an equation (Formula 3).

$$\text{cov}(X)p_i = \lambda_i p_i \quad \text{(Formula 3)}$$

$\lambda_i$ is a scalar value based on the eigenvector $p_i$ known as an eigenvalue.

$$Xp_i = t_1 \quad \text{(Formula 4)}$$

The matrix data X is expressed by $t_i$ and $p_i$ as shown in an equation (Formula 4).

The first principal component (or plurality of principal components from top) obtained from the principal component analysis is a temporal change component of the external light measurement data recorded in the physical environment measurement data recording unit 611 of the apparatus. Since the temporal change in the measurement data of the external light is mainly caused by the change in the surface state of the quartz, the first principal component (or plurality of principal components from top) is a temporal change component accompanying a change in the surface state of quartz.

Next, the physical environment change component extraction unit 622 projects the plasma spectroscopic measurement data, that is, the apparatus data recorded in the apparatus data recording unit 612 and preprocessed in the preprocessing unit 621 on the principal component space (S4005: corresponds to S3002 in FIG. 3). In the physical environment change component removing unit 623, the first principal component (or plurality of principal components from top) is multiplied by the coefficient zero from the plasma spectroscopic measurement data, and the first principal component (or plurality of principal components from top) is removed (S4006: corresponds to S3003 in FIG. 3). Next, in the physical environment change component removing unit 623, the plasma spectroscopic measurement data is reconverted to the original data space (S4007: corresponds to S3004 in FIG. 3), and an operation is performed in the apparatus state prediction calculation unit 630 using the reconverted plasma spectroscopic measurement data as input data of the apparatus state prediction calculation (S4008: corresponds to S3005 in FIG. 3).

With the above sequence, in the plasma spectroscopic measurement data, which is the apparatus data, the quartz change component is canceled, and it is corrected to data including only the temporal change component caused by accumulation of the reaction product to be monitored. These series of sequences are executed each time the plasma processing is performed on the sample. Accordingly, it is possible to remove change component accompanying the temporal change of the quartz state from the apparatus data obtained for each sample processing and to perform the operation to predict the apparatus state.

As a modification example of the measurement of the quartz surface change and the removal sequence of the quartz surface change component explained in FIG. 4, an example in which the external light spectroscopic measurement data acquisition step of S4001 is changed will be described with reference to FIG. 5 as a modification of the embodiment of the present invention.

The flowchart shown in FIG. 5 shows a second modification example of the measurement of the quartz surface change and the removal sequence of the quartz surface change component using the external light (or rare gas discharge) according to the embodiment of the present invention.

First, a plurality of quartz windows 201-A and 201-B (or quartz cover 115) with different quartz consumption are prepared and one of them is attached to the plasma etching apparatus 100 (S5001). In the plasma etching apparatus 100, when the plasma processing is not being performed (state in which plasma is not generated inside the processing chamber 101), in the external light emitted from the external light source 202, transmitted through the quartz window 201-A, and passed through inside the processing chamber 101, the external light transmitted through the quartz window 201-B is spectroscopically measured by the spectroscopic measurement device 203. The obtained spectroscopic measurement data is stored in the physical environment measurement data recording unit 611 of the apparatus of the data recording unit 610 as reference data (S5002: corresponds to S4001 in FIG. 4).

S5001 and S5002 are repeatedly executed while replacing the plurality of prepared quartz windows 201-A and 201-B (or quartz cover 115) with different quartz consumption with the plasma etching apparatus 100, and the acquired spectroscopic measurement data is accumulated in the physical environment measurement data recording unit 611 of the apparatus as the reference data.

Next, by repeatedly executing S5001 and S5002, for the data group of the reference data stored in the physical environment measurement data recording unit 611, preprocessing is performed in the preprocessing unit 621 of the data correction unit 620 (S5003: corresponds to S4003 in FIG. 4). The preprocessing method executed in S5003 is the same as the preprocessing described in S4003.

With respect to the reference data subjected to preprocessing in S5003, the principal component analysis is performed in the physical environment change component extraction unit 622 and the principal component space is constructed (S5004: corresponds to S3001 in FIG. 3 and S4004 in FIG. 4). The principal component and the number of the coefficients acquired from the principal component analysis are stored as the principal component data in a principal component data storage unit (not shown) in the physical environment change component extraction unit 622.

Next, the control apparatus 200 controls the plasma etching apparatus 100 to generate plasma in the processing chamber 101 to perform plasma processing of the sample, during that time, the plasma emission spectroscopic measurement data is acquired by measuring the emission of the plasma generated inside the processing chamber 101 as the apparatus data by the spectroscopic measurement device 203 via the quartz window 201-B, and stored in the apparatus data recording unit 612 (S5101: corresponds to S4002 in FIG. 4).

The apparatus data acquired in advance by the method shown in advance (S5101) may be stored in the apparatus data recording unit 612. In the case, it is preferable that the apparatus data acquired by starting the processing in the processing chamber in which the quartz windows 201-A and 201-B and the quartz cover 115 in which the change in the film thickness, generation of roughness, and change in the surface state change such as fogging did not occur are installed from the apparatus whose apparatus state is known to be healthy is stored. In a case where the prior data set is stored, it is preferable to start recording of the apparatus data indicated in (S5101) from the same (or similar) apparatus state with the apparatus state in which the prior data set acquired.

Thereafter, the preprocessing unit 621 performs preprocessing in the same manner as the preprocessing described in S5003 (S5102: corresponds to S4003 in FIG. 4). The physical environment change component extraction unit 622 projects the plasma spectroscopic measurement data as the apparatus data on the principal component space using the principal component data stored in the principal component data (S5103: corresponds to S3002 in FIG. 3 and S4005 in FIG. 4), and in the physical environment change component removing unit 623, the first principal component (or plurality of principal components from top) is multiplied by the coefficient zero from the plasma spectroscopic measurement data projected to the principal component space, the first principal component (or plurality of principal components from top) is removed (S5104: corresponds to S4006 in FIG. 4).

Finally, in the physical environment change component removing unit 623, the plasma spectroscopic measurement data is reconverted to the original data space (S5105: corresponds to S4007 in FIG. 4), an operation is performed to predict the apparatus state in the apparatus state prediction calculation unit 630 using the converted plasma spectroscopic measurement data as input data of the apparatus state prediction calculation unit 630 (S5106: corresponds to S4008 in FIG. 4).

These series of sequences are repeatedly executed each time the plasma processing of the sample is performed in the plasma etching apparatus 100. Accordingly, it is possible to perform the operation to predict the apparatus state of the plasma etching apparatus 100 by removing change component accompanying the temporal change of the quartz state (transmittance of plasma light) of the quartz window 201-B from the apparatus data of the plasma etching apparatus 100 acquired for each sample processing.

In the present embodiment, although removing the emission intensity change component that is caused by the change in the quartz fogging amount, change in the film thickness, and change in the roughness in the quartz windows 201-A and 201-B that are installed for the light induction of the spectroscopic measurement and the quartz cover 115 installed to cover the inner wall of the plasma etching apparatus 100 is explained as an example in the plasma emission measurement data, a similar method can be applied when removing the plasma impedance change component caused by the change in the film thickness of the insulating film layer formed on the grounded apparatus inner wall portion in the plasma impedance measurement data. In that case, the above-described external light measurement and plasma spectroscopic measurement may be replaced by the plasma impedance measurement.

In the plasma impedance measurement, it is possible to set the temporal change component of the film thickness of the insulating layer formed on the substrate electrode 109 or on the earth 114 as a removal target in addition to the temporal change component of the thickness of the quartz windows 201-A and 201-B the quartz cover 115.

Figure 6:
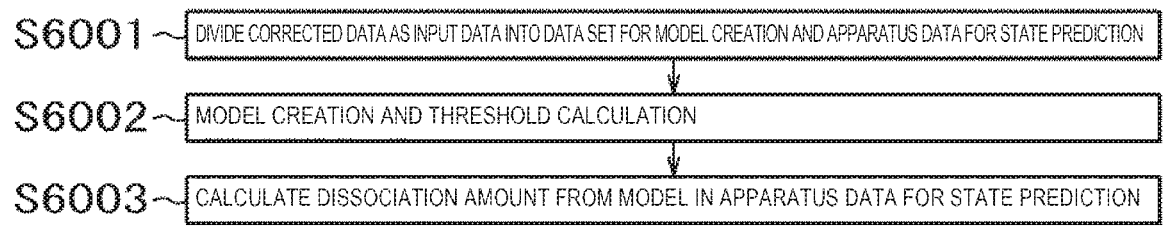
FIG. 6 is a flowchart showing an apparatus state prediction calculation sequence according to the embodiment of the present invention.

FIG. 6 shows the apparatus state prediction calculation sequence according to the embodiment of the present invention, and corresponds to the detailed contents of S4007 of the process flow in the present embodiment described in FIG. 4 or S5105 of the process flow in the modification example described in FIG. 5. The apparatus state prediction calculation sequence is executed by the apparatus state prediction calculation unit 630 in response to the data from the apparatus state prediction calculation unit 630.

First, the apparatus data reconverted in S4008 or S5106 by the physical environment change component removing unit 623 of the apparatus state prediction calculation unit 630 as input data are divided into the data set for model creation as a reference and the apparatus data to predict the state in the model creation and threshold calculation unit 631 (S6001). In the present embodiment, the data set for model creation as a reference is the data set collected during periods known as healthy apparatus states, and in the present embodiment, the data set recorded during an initial state of the apparatus is used.

Next, creation of a model and calculation of a threshold is performed in the model creation and threshold calculation unit 631 (S6002). Finally, the soundness index calculation unit 632 calculates a dissociation amount from the created model in the model creation and threshold calculation unit 631 in the apparatus data for state prediction input from the physical environment change component removing unit 623 of the apparatus state prediction calculation unit 630 (S6003).

A machine learning algorithm is used for calculation of creating a model and calculating the threshold in the model creation and threshold calculation unit 631 and calculation of the soundness index value in the soundness index calculation unit 632. For example, various generally known machine learning algorithms such as those recorded in Machine learning by Kevin P. Murphy can be applied. In the present embodiment, a case of using T-squared statistics and statistics applying principal component analysis which is one kind of multivariate analysis will be described.

In S4007 of the sequence shown in FIG. 4 or S5105 of the sequence shown in FIG. 5, after removing the temporal change component of the apparatus physical environment from the apparatus data in the physical environment change component removing unit 623, according to the sequence explained using FIG. 6, after dividing the data set for model creation and the apparatus data for state prediction in S6001, the principal component analysis is performed with respect to the data set for model creation. Thereafter, learning data and evaluation data are reconstructed in the principal component space, calculation of the threshold for determining an abnormality is performed in S6002, and the soundness index value indicating the apparatus state with respect to the apparatus data for state prediction for each state is calculated in S6003.

As described-above, T-squared statistics and Q statistics are used for the calculation of the threshold in S6002, and the calculation of the soundness index value in S6003. In T-squared statistics, the variation is based on the F distribution. The threshold is defined as a rejection region 1% excluding a confidence interval 99%, and it is defined such that the apparatus data for state prediction corresponding to the rejection region is determined to be abnormal.

To calculate the threshold, use the equation (Formula 5).

$$T_\alpha^2 = \frac{r(m-1)}{m-r} F_{r, m-r, \alpha} \qquad \text{(Formula 5)}$$

Here, $T_\alpha^2$ indicates a threshold having the confidence interval 99%, m is the number of samples of X, r is the number of stored principal component PCs, $F_{r, m-r, \alpha}$ indicates a rejection region $\alpha\%$ of F distribution having r and (m-r) degrees of freedom.

After calculating the threshold in S6002, the soundness index value of the apparatus data for state prediction for each state in S6003 is calculated by the following equation (Formula 6).

$$T^2 = t\Sigma^{-1}t^T \qquad \text{(Formula 6)}$$

t is data having k columns projected on the PC space, and $\Sigma^{-1}$ is an inverse square matrix of eigenvalues $\lambda_i$ up to the rth in descending order of the correlation matrix.

Q statistics is based on the $X^2$ distribution. In the case of Q statistics as well as the case of T-squared statistics, the threshold is defined as a rejection region 1% excluding a confidence interval 99%, and it is defined such that the apparatus data for state prediction corresponding to the rejection region is determined to be abnormal.

To calculate the threshold, the following equation is used.

$$SPE_\alpha = \theta_1 \left[ \frac{c_\alpha \sqrt{2\theta_2 h_0^2}}{\theta_1} + 1 + \frac{\theta_2 h_0 \sqrt{\theta_2 h_0 (h_0-1)}}{\theta_1} \right]^{\frac{1}{h_0}} \qquad \text{(Formula 7)}$$

$$\theta_1 = \sum_{s=r+1}^{n} \lambda_s^i, \; i=1,2,3, \; h_0 = 1 - \frac{2\theta_1 \theta_3}{3\theta_2^2}$$

Q statistics is expressed by the equation (Formula 8).

$$Q = \Sigma E^2 = \Sigma_{j=1}^{n} e_j^2 \qquad \text{(Formula 8)}$$

In Q statistics, it is calculated as the sum of squares of the error term E of the apparatus data for state prediction for each state as follows. $e_j$ denotes jth residual.

Figure 7:
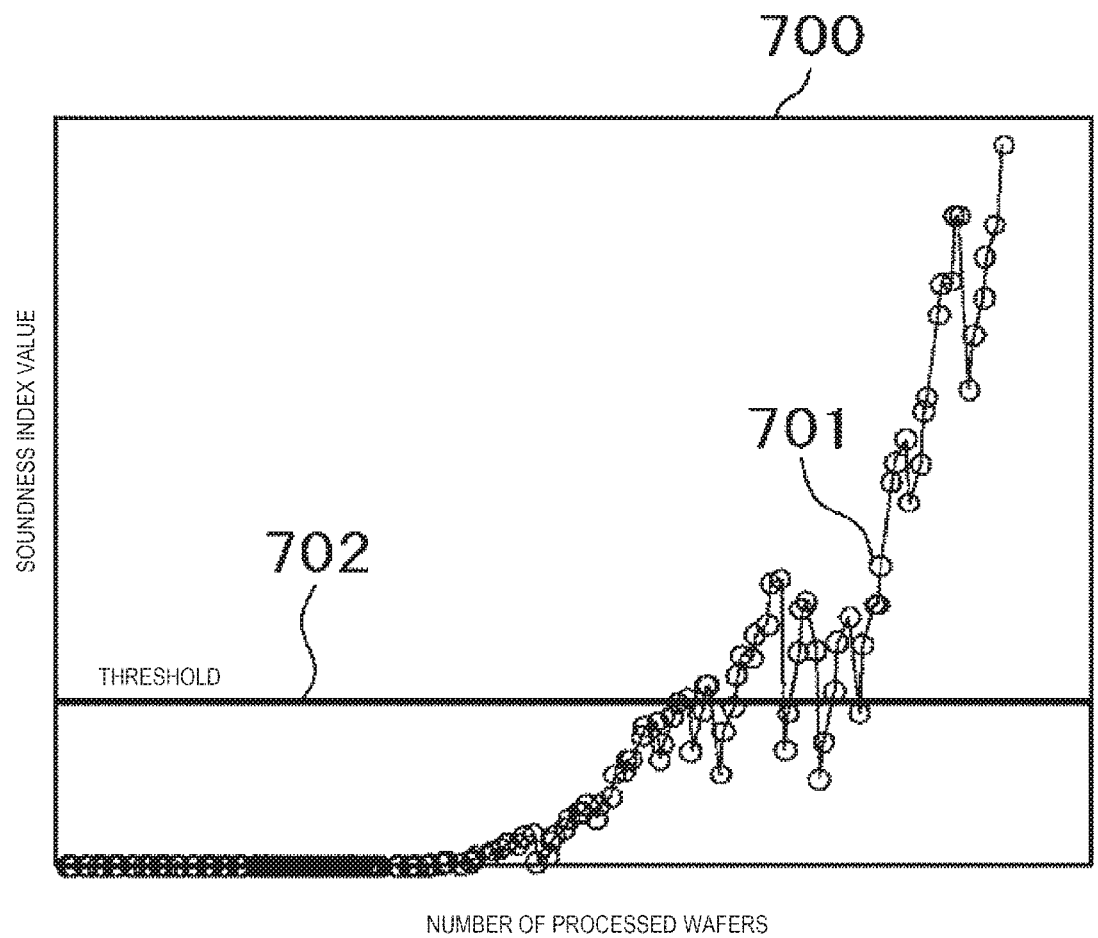
FIG. 7 is a graph showing an example of an apparatus state prediction result according to the embodiment of the present invention.

FIG. 7 is an example of the apparatus state prediction calculation result according to the embodiment of the present invention calculated in the S6001 to S6003 steps using the corrected apparatus data by removing the temporal change component of the apparatus physical environment data, and shows the relationship between the transition of the soundness index value and the threshold value with respect to the number of processed wafers. The transition of the soundness index value and the threshold value were calculated using T-squared. As the continuous operation time (wafer processed number) of the apparatus increases, it can be seen that the soundness index value increases. As described above, it is possible to determine and detect the abnormality by monitoring the relationship between the calculated soundness index value and the threshold value.

During actual operation, for example, in a case where the soundness index value calculated by the soundness index calculation unit 632 continuously exceeds the threshold calculated by the model creation and threshold calculation unit 631, it is better to perform rule-controlled control in advance such as outputting an apparatus control signal for stopping the plasma etching apparatus 100 from the output unit 641 of the determination/control unit 640 to the plasma etching apparatus 100, outputting a warning message signal such as urging maintenance, or outputting the apparatus control signal and the warning message signal to the plasma etching apparatus 100 at the same time.

According to the above-described embodiment, in the plasma processing apparatus that processes a sample, it is possible to capture the continuous temporal change components in physical environment change of the apparatus that does not affect the plasma processing result but greatly affects the data acquired from the apparatus, to remove only the change component from the input data in calculation for performing the apparatus state prediction, and to improve the prediction accuracy of the apparatus state.

According to the present embodiment, in the plasma processing apparatus, it is possible to detect the apparatus abnormality that affects the plasma processing result as the prediction target with high accuracy, and accurately predict a time for maintenance.

The invention made by the present inventors is described in detail based on the embodiments, but the present invention is not limited to the embodiments. It goes without saying that various modifications can be made without departing from the gist thereof. For example, the embodiments described above are described in detail for describing the present invention in an easily understandable manner, and are not necessarily limited to those including all the configurations described. It is possible to add/remove/replace another configuration with respect to a part of the configurations of the embodiments described above.

What is claimed is:

1. A plasma processing apparatus comprising:
   a processing chamber in which a sample is subjected to plasma processing; and
   a state prediction apparatus configured to;
   predict a state of the processing chamber;
   remove a temporal change component of a physical environment of the processing chamber from first data monitored during the plasma processing; and perform an operation to predict the state of the processing chamber using the first data from which the temporal change component is removed as input data, wherein the temporal change component is extracted from second data indicating the physical environment of the processing chamber.

2. The plasma processing apparatus according to claim 1, wherein the state prediction apparatus constructs a principal component space of the second data by performing a principal component analysis using the second data, and removes the temporal change component from the first data by projecting the first data on the principal component space to remove a first principal component or a plurality of principal components from the first data projected on the principal component space and to be returned to an original data space.

3. The plasma processing apparatus according to claim 2, wherein the first data includes emission data of plasma, and wherein the second data includes data of external light acquired by changing an internal state of the processing chamber.

4. The plasma processing apparatus according to claim 3, wherein changing the internal state of the processing chamber includes changing a fogging amount of a quartz cover that is disposed to cover an inner wall of the processing chamber, a surface state of the quartz cover, a thickness of the quartz cover, a fogging amount of a transmission window through which the external light passes, a surface state of the transmission window or a thickness of the transmission window.

5. The plasma processing apparatus according to claim 2, wherein the first data includes plasma impedance acquired by a radio frequency voltage applied to a sample stage on which the sample is placed and a radio frequency current that flows in the sample stage during the plasma processing of the sample, and wherein the second data is acquired by changing a thickness of a quartz cover that is disposed so as to cover an inner wall of the processing chamber, and includes plasma impedance acquired by the radio frequency voltage or the radio frequency current.

6. The plasma processing apparatus according to claim 2, wherein the state prediction apparatus performs arithmetic operation to predict the state of the processing chamber using a principal component analysis (PCA)-T-squared or a PCA-state prediction estimation (SPE).

7. The plasma processing apparatus according to claim 2, wherein the state prediction apparatus performs processing that removes an outlier from the second data as preprocessing when performing a principal component analysis on the second data.

8. The plasma processing apparatus according to claim 2, wherein the state prediction apparatus performs processing that extracts a feature value from the second data as preprocessing when performing a principal component analysis on the second data.

9. The plasma processing apparatus according to claim 8, wherein the state prediction apparatus extracts statistics as the feature value of the second data.

10. The plasma processing apparatus according to claim 8, wherein the state prediction apparatus extracts a frequency component as the feature value of the second data.

11. The plasma processing apparatus according to claim 2, wherein the state prediction apparatus uses a machine learning algorithm as a method of extracting the temporal change component of the physical environment from the second data.

12. The plasma processing apparatus according to claim 2, wherein the state prediction apparatus uses a non-linear algorithm as a method of extracting the temporal change component of the physical environment from the second data.

13. The plasma processing apparatus according to claim 7, wherein the state prediction apparatus performs standardization processing on data as preprocessing when performing the principal component analysis on the second data.

14. The plasma processing apparatus according to claim 2, wherein the state prediction apparatus acquires the first data and the second data at every intervals of sampling frequency of 5 Hz or higher.

15. A state prediction apparatus that predicts a state of a processing chamber in which a sample is subjected to plasma processing, the apparatus comprising:

an arithmetic processor configured to perform an operation to predict state of the processing chamber using first data monitored during the plasma processing, from which a temporal change component of a physical environment of the processing chamber is removed as input data, wherein the temporal change component is extracted from second data indicating the physical environment of the processing chamber.

* * * * *